(12) United States Patent
Yu et al.

(10) Patent No.: US 6,872,647 B1
(45) Date of Patent: Mar. 29, 2005

(54) METHOD FOR FORMING MULTIPLE FINS IN A SEMICONDUCTOR DEVICE

(75) Inventors: Bin Yu, Cupertino, CA (US); Judy Xilin An, San Jose, CA (US); Cyrus E. Tabery, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/429,780

(22) Filed: May 6, 2003

(51) Int. Cl.[7] .................... H01L 21/3205; H01L 21/20; H01L 21/311

(52) U.S. Cl. ................. 438/585; 438/587; 438/399; 438/696

(58) Field of Search ................. 438/696, 595, 438/399, 584–588

(56) References Cited

U.S. PATENT DOCUMENTS

| | | | | |
|---|---|---|---|---|
| 5,942,787 A | * | 8/1999 | Gardner et al. | 257/408 |
| 6,110,837 A | * | 8/2000 | Linliu et al. | 438/723 |
| 6,159,820 A | * | 12/2000 | Park | 438/396 |
| 6,225,201 B1 | * | 5/2001 | Gardner et al. | 438/585 |
| 6,271,113 B1 | * | 8/2001 | Yoon et al. | 438/618 |
| 6,362,057 B1 | * | 3/2002 | Taylor et al. | 438/286 |
| 6,391,753 B1 | * | 5/2002 | Yu | 438/587 |
| 6,391,782 B1 | * | 5/2002 | Yu | 438/696 |
| 6,475,869 B1 | * | 11/2002 | Yu | 438/303 |
| 6,479,343 B1 | * | 11/2002 | Hwang et al. | 438/253 |
| 6,492,212 B1 | * | 12/2002 | Ieong et al. | 438/157 |
| 6,509,253 B1 | * | 1/2003 | Yu | 438/585 |
| 6,642,090 B1 | * | 11/2003 | Fried et al. | 438/164 |
| 6,664,173 B2 | * | 12/2003 | Doyle et al. | 438/587 |
| 6,706,571 B1 | * | 3/2004 | Yu et al. | 438/157 |
| 6,709,982 B1 | * | 3/2004 | Buynoski et al. | 438/696 |
| 6,787,439 B2 | * | 9/2004 | Ahmed et al. | 438/585 |
| 6,815,268 B1 | * | 11/2004 | Yu et al. | 438/149 |
| 2003/0006410 A1 | * | 1/2003 | Doyle | 257/20 |
| 2003/0027059 A1 | * | 2/2003 | Schweeger | 430/5 |
| 2003/0054623 A1 | * | 3/2003 | Weimer et al. | 438/587 |

OTHER PUBLICATIONS

Digh Hisamoto et al., "FinFET–A Self–Aligned Double––Gate MOSFET Scalable to 20 nm," IEEE Transactions on Electron Devices, vol. 47, No. 12, Dec. 2000, pp. 2320–2325.

Yang–Kyu Choi et al., "Sub–20nm CMOS FinFET Technologies," 2001 IEEE, IEDM, pp. 421–424.

Xuejue Huang et al., "Sub–50 nm P–Channel FinFET," IEEE Transactions on Electron Devices, vol. 48, No. 5, May 2001, pp. 880–886.

Xuejue Huang et al., "Sub 50–nm FinFET: PMOS," 1999 IEEE, IEDM, pp. 67–70.

Yang–Kyu Choi et al., "Nanoscale CMOS Spacer FinFET for the Terabit Era," IEEE Electron Device Letters, vol. 23, No. 1, Jan. 2002, pp. 25–27.

* cited by examiner

Primary Examiner—Matthew Smith
Assistant Examiner—Chuong Anh Luu
(74) Attorney, Agent, or Firm—Harrity & Snyder, LLP

(57) ABSTRACT

A method of forming multiple fins in a semiconductor device includes forming a structure having an upper surface and side surfaces on the semiconductor device. The semiconductor device includes a conductive layer located below the structure. The method also includes forming spacers adjacent the structure and selectively etching the spacers and the conductive layer to form the fins. The fins may be used in a FinFET device.

20 Claims, 14 Drawing Sheets

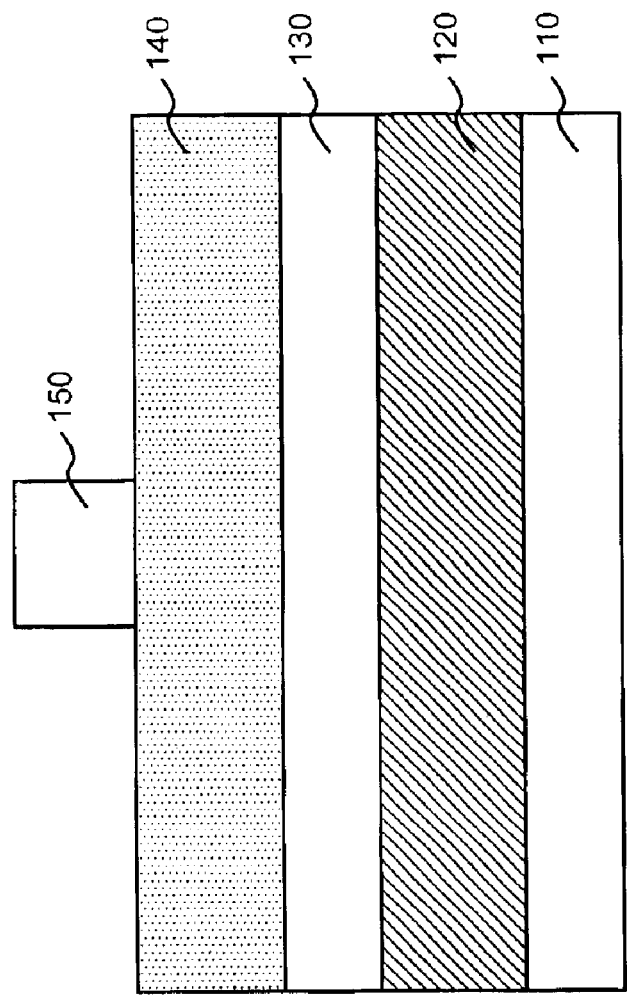

METHOD FOR FORMING MULTIPLE FINS IN A SEMICONDUCTOR DEVICE

TECHNICAL FIELD

The present invention relates to semiconductor devices and methods of manufacturing semiconductor devices. The present invention has particular applicability to double-gate devices.

BACKGROUND ART

The escalating demands for high density and performance associated with ultra large scale integration semiconductor devices require design features, such as gate lengths, below 100 nanometers (nm), high reliability and increased manufacturing throughput. The reduction of design features below 100 nm challenges the limitations of conventional methodology.

For example, when the gate length of conventional planar metal oxide semiconductor field effect transistors (MOSFETs) is scaled below 100 nm, problems associated with short channel effects, such as excessive leakage between the source and drain, become increasingly difficult to overcome. In addition, mobility degradation and a number of process issues also make it difficult to scale conventional MOSFETs to include increasingly smaller device features. New device structures are therefore being explored to improve FET performance and allow further device scaling.

Double-gate MOSFETs represent new structures that have been considered as candidates for succeeding existing planar MOSFETs. In double-gate MOSFETs, two gates may be used to control short channel effects. A FinFET is a double-gate structure that exhibits good short channel behavior. A FinFET includes a channel formed in a vertical fin. The FinFET structure may be fabricated using layout and process techniques similar to those used for conventional planar MOSFETs.

DISCLOSURE OF THE INVENTION

Implementations consistent with the present invention provide methods for forming multiple fins for use in a FinFET device. The fins, consistent with the present invention, may be formed with a small pitch.

Additional advantages and other features of the invention will be set forth in part in the description which follows and in part will become apparent to those having ordinary skill in the art upon examination of the following or may be learned from the practice of the invention. The advantages and features of the invention may be realized and obtained as particularly pointed out in the appended claims.

According to the present invention, the foregoing and other advantages are achieved in part by a method of forming multiple fins in a FinFET device. The method includes forming a dielectric layer on a silicon on insulator (SOI) wafer, where the SOI wafer includes a conductive layer disposed on an insulating layer and the conductive layer is used to form the fins. The method also includes forming a structure on a portion of the dielectric layer, where the structure includes an upper surface and side surfaces. The method also includes forming a first plurality of spacers adjacent the side surfaces of the structure and forming a second plurality of spacers adjacent the first plurality of spacers. The method further includes planarizing the structure and the first and second plurality of spacers and removing the structure, the second plurality of spacers and a portion of the dielectric layer located below the second plurality of spacers. A remaining portion of the dielectric layer forms a plurality of dielectric structures located below the first plurality of spacers. The method also includes removing the first plurality of spacers and a portion of the conductive layer not located below the plurality of dielectric structures to form the fins.

According to another aspect of the invention, a method of manufacturing a semiconductor device is provided. The method includes depositing a dielectric layer over a conductive layer and forming a first structure over the dielectric layer. The first structure has a substantially rectangular cross-sectional shape. The method also includes, forming a plurality of first spacers on side surfaces of the first structure and etching the first structure and the dielectric layer, where the etching results in a plurality of dielectric structures located below the plurality of first spacers. The method further includes etching the plurality of first spacers and the conductive layer, where the dielectric structures act as a mask to prevent a portion of the conductive layer from being etched and an un-etched portion of the conductive layer forms a number of fins.

According to a further aspect of the invention, a method of forming multiple structures in a semiconductor device is provided. The method includes forming a first structure over a conductive layer, where the first structure has an upper surface and side surfaces. The method also includes forming a first plurality of spacers adjacent the side surfaces of the first structure and forming a second plurality of spacers adjacent the first plurality of spacers. The method further includes etching the first plurality of spacers and the conductive layer, where the first structure and the second plurality of spacers act as a mask to prevent a portion of the conductive layer from being etched. An un-etched portion of the conductive layer forms the multiple structures.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

FIG. 1 is a cross-section illustrating exemplary layers/structures that may be used for forming fins in accordance with an exemplary embodiment of the present invention.

BEST MODE FOR CARRYING OUT THE INVENTION

Figure 2A:
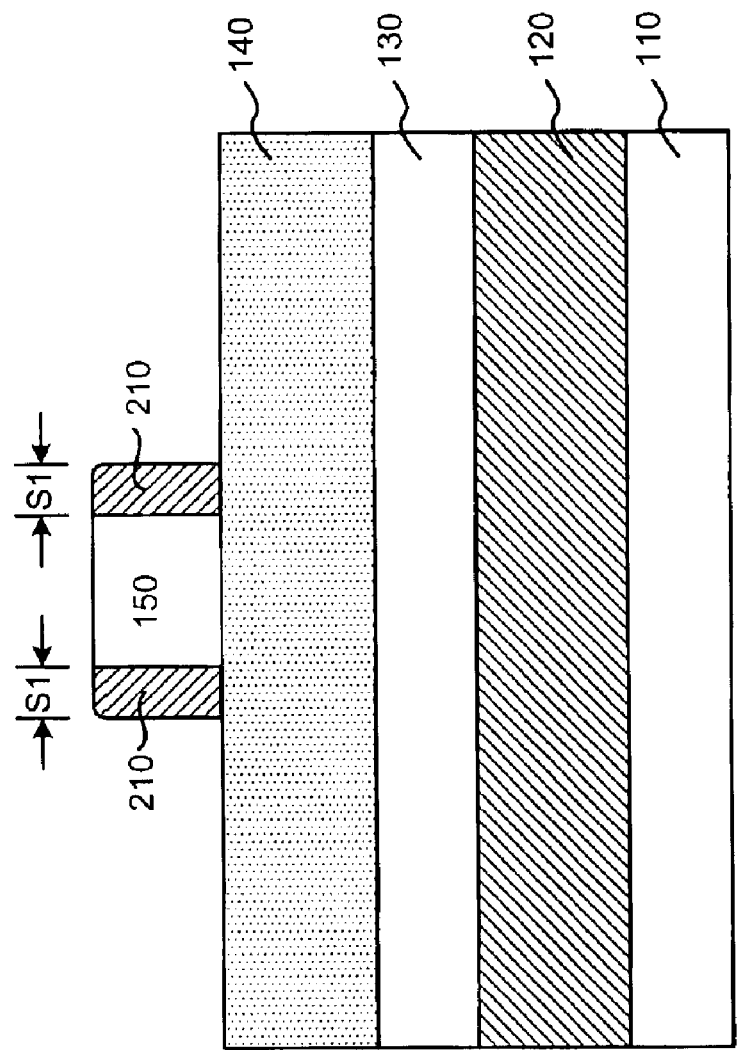
FIGS. 2A–2D are cross-sections illustrating the formation of spacers on the device of FIG. 1 in accordance with an exemplary embodiment of the present invention.

The following detailed description of the invention refers to the accompanying drawings. The same reference numbers in different drawings may identify the same or similar elements. Also, the following detailed description does not limit the invention. Instead, the scope of the invention is defined by the appended claims and their equivalents.

Implementations consistent with the present invention provide double-gate FinFET devices with multiple fins and methods of manufacturing such devices. The fins formed in accordance with the present invention may have a small pitch (i.e., distance between the fins) based on the particular device requirements.

FIG. 1 illustrates the cross-section of a semiconductor device 100 formed in accordance with an embodiment of the present invention. Referring to FIG. 1, semiconductor device 100 may include a silicon on insulator (SOI) structure that includes a silicon substrate 110, a buried oxide layer 120 and a silicon layer 130 on the buried oxide layer 120. Buried oxide layer 120 and silicon layer 130 may be formed on substrate 110 in a conventional manner.

In an exemplary implementation, buried oxide layer 120 may include a silicon oxide, such as $SiO_2$, and may have a thickness ranging from about 1500 Å to about 3000 Å. Silicon layer 130 may include monocrystalline or polycrystalline silicon having a thickness ranging from about 200 Å to about 1000 Å. Silicon layer 130 is used to form multiple active lines or fins for a double-gate transistor device, as described in more detail below.

In alternative implementations consistent with the present invention, substrate 110 and layer 130 may comprise other semiconducting materials, such as germanium, or combinations of semiconducting materials, such as silicon-germanium. Buried oxide layer 120 may also include other dielectric materials.

A dielectric layer 140 may be formed over silicon layer 130. Dielectric layer 140 may comprise an oxide, such as $SiO_2$, and may be deposited in a convention manner. In an exemplary implementation, dielectric layer 140 may be deposited to a thickness ranging from about 200 Å to about 1000 Å.

Next, a dielectric material may be deposited and patterned to form structure 150, also referred to as island 150, as illustrated in FIG. 1. The dielectric material may be deposited and patterned in a conventional manner to form island 150. The island 150 may comprise a silicon oxide, e.g., $SiO_2$, or another dielectric material, and may be used to facilitate the formation of a number of active lines. In an exemplary implementation, the cross-sectional shape of island 150 is substantially rectangular and the cross-sectional width of island 150 may range from about 300 Å to about 1000 Å. It should be understood, however, that the particular width may vary based on the particular circuit requirements associated with the fins in the FinFET device that will be formed. In addition, the height of island 150 may range from, for example, about 500 Å to about 1500 Å.

Spacers 210 may then be formed on the sidewalls of island 150, as illustrated in FIG. 2A. Spacers 210 may comprise, for example, polysilicon, and may be formed by depositing a layer of polysilicon and etching the polysilicon to form the spacers 210. Alternatively, spacers 210 may be formed using other conventional techniques. According to an exemplary implementation consistent with the present invention, the width of spacers, designated by "S1" in FIG. 2A, ranges from about 100 Å to about 500 Å.

Figure 2B:
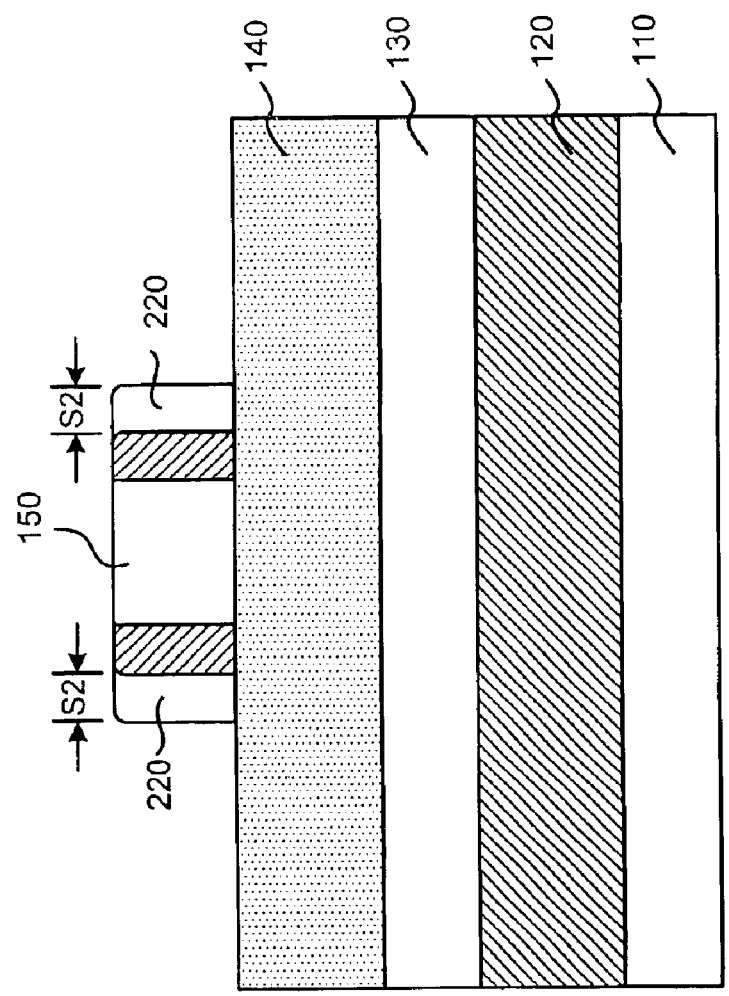

Next, spacers 220 may be formed on semiconductor device 100 adjacent spacers 210, as illustrated in FIG. 2B. Spacers 220 may comprise a dielectric material, such as $SiO_2$, and may be formed by depositing a dielectric layer and etching the dielectric layer to form the spacers 220. Alternatively, spacers 220 may be formed using other conventional techniques. According to an exemplary implementation consistent with the present invention, the width of spacers 220, designated by "S2" in FIG. 2B, ranges from about 200 Å to about 1000 Å. As will be apparent from the description below, the width of spacers 210 and 220 will define the pitch of the subsequently formed fins.

Figure 2C:
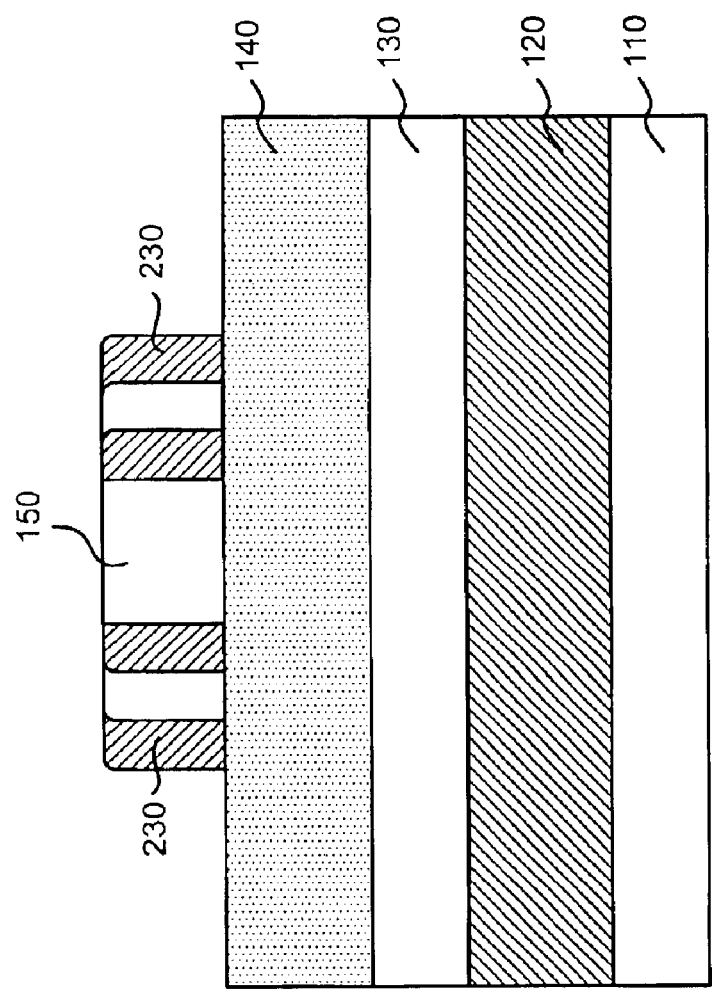

Next, another set of spacers 230 may be formed on semiconductor device 100 adjacent spacers 220, as illustrated in FIG. 2C. Spacers 230 may be formed in a similar manner as spacers 210. For example, in an exemplary implementation, spacers 230 may comprise polysilicon and the width of spacers 230 may be approximately the same as the width of spacers 210.

Figure 2D:
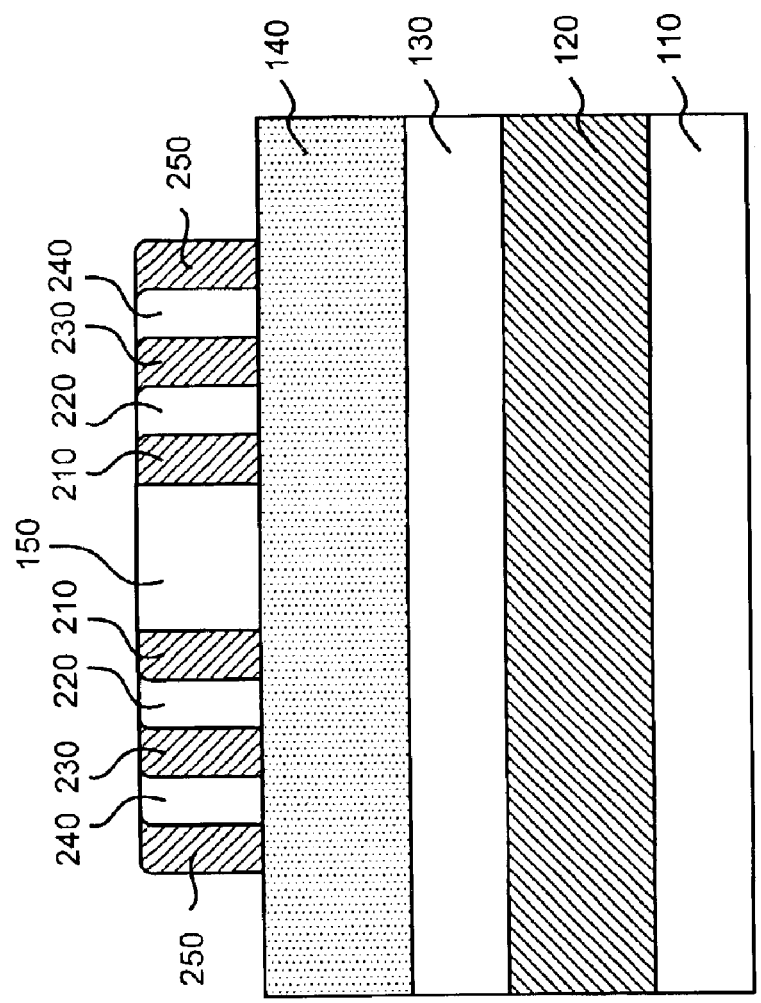

The processes for forming spacers as discussed with respect to FIGS. 2A–2C may be repeated a number of times to form additional spacers, as illustrated in FIG. 2D. Referring to FIG. 2D, semiconductor device 100 includes spacers 210–250 formed along the side surfaces of island 150, with the spacers being formed in an alternating manner. That is, spacers 210, 230 and 250 may comprise a conductive material, such as polysilicon, and spacers 220 and 240 may comprise a dielectric material, such as silicon dioxide. In one implementation consistent with the present invention, the particular number of spacers formed may be chosen so that the number of polysilicon spacers formed is equal to the number of subsequently formed fins. For example, in the implementation illustrated in FIG. 2D, six fins will subsequently be formed. It will be appreciated that the particular number of fins to be formed may vary based on the circuit requirements.

Figure 3:
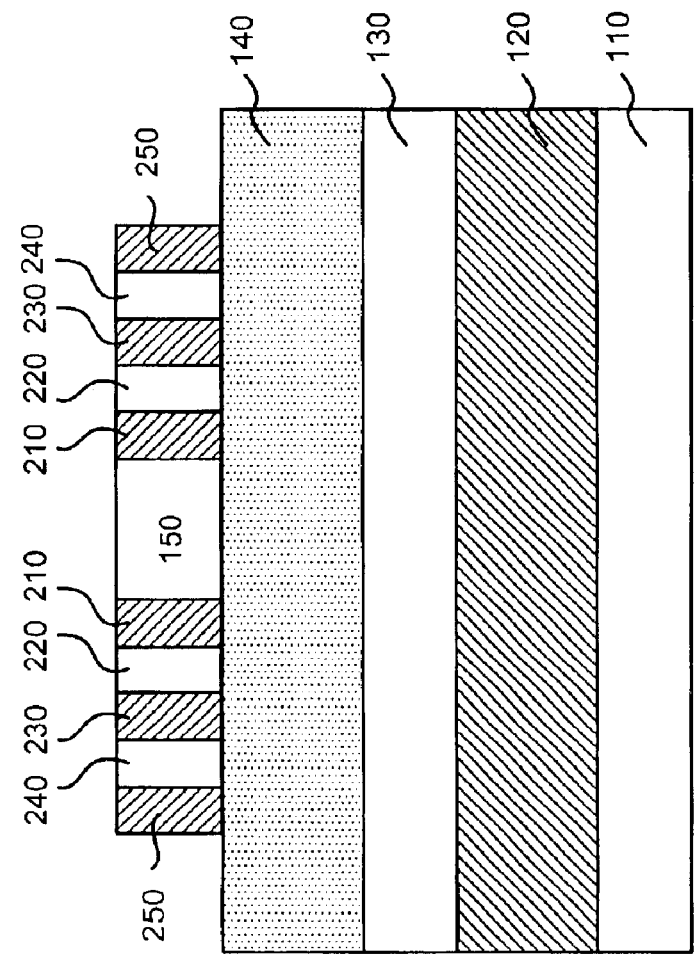
FIG. 3 is a cross-section illustrating the planarization of the device of FIG. 2D in accordance with an exemplary embodiment of the present invention.

It should be understood that in some implementations, spacers 210–250 may have a more rounded shape at their respective upper portions and may overlap one another. Semiconductor device 100 may be polished via a chemical-mechanical polishing (CMP) to planarize the top surface of semiconductor device 100 such that the top surfaces of each of spacers 210–250 are exposed, as illustrated in FIG. 3. During the CMP, a portion of the upper surface of island 150 and spacers 210–250 may be removed so that the upper surface of each of the spacers 210–250 is exposed.

Figure 4:
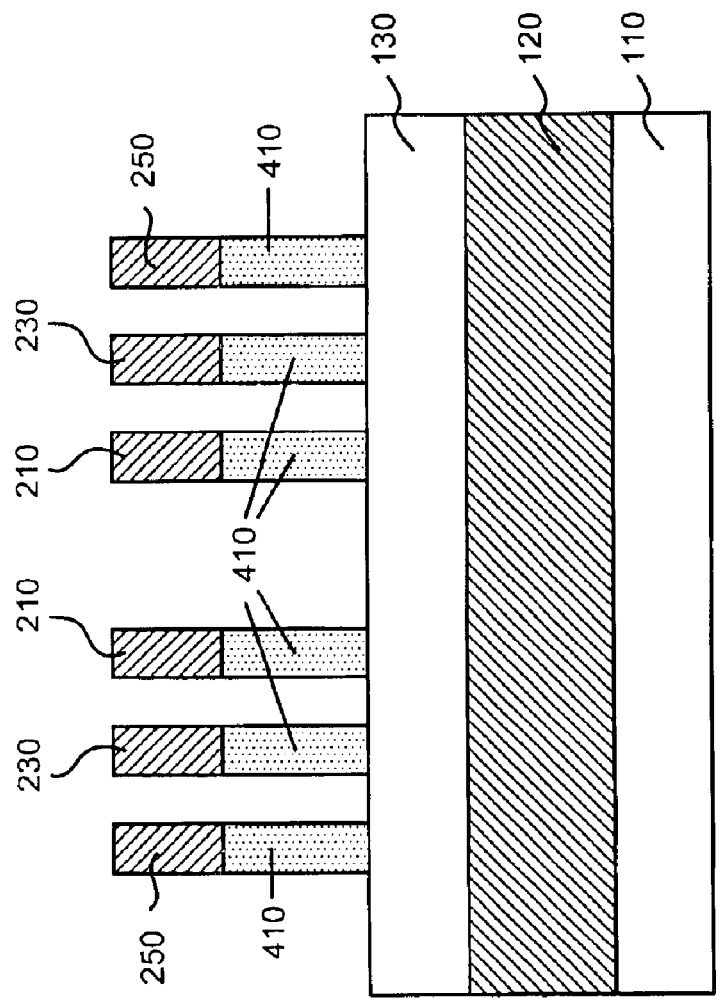
FIG. 4 is a cross-section illustrating the formation of dielectric structures on the device of FIG. 3 in accordance with an exemplary embodiment of the present invention.

After the semiconductor device 100 has been planarized, semiconductor device 100 may be etched to remove island 150, oxide spacers 220 and 240 and the portions of dielectric layer 140 not protected by polysilicon spacers 210, 230 and 250, as illustrated in FIG. 4. The etching may be a dry etching process performed in a conventional manner that removes the exposed oxide portions and terminates on silicon layer 130. Referring to FIG. 4, after the etching has been completed, polysilicon spacers 210, 230 and 250 remain with dielectric structures 410 formed beneath spacers 210, 230 and 250. The dielectric structures 410 correspond to the portions of dielectric layer 140 that have not been etched. The dielectric structures 410 may be used as a hard mask to facilitate the formation of fins, as described in more detail below.

Figure 5:
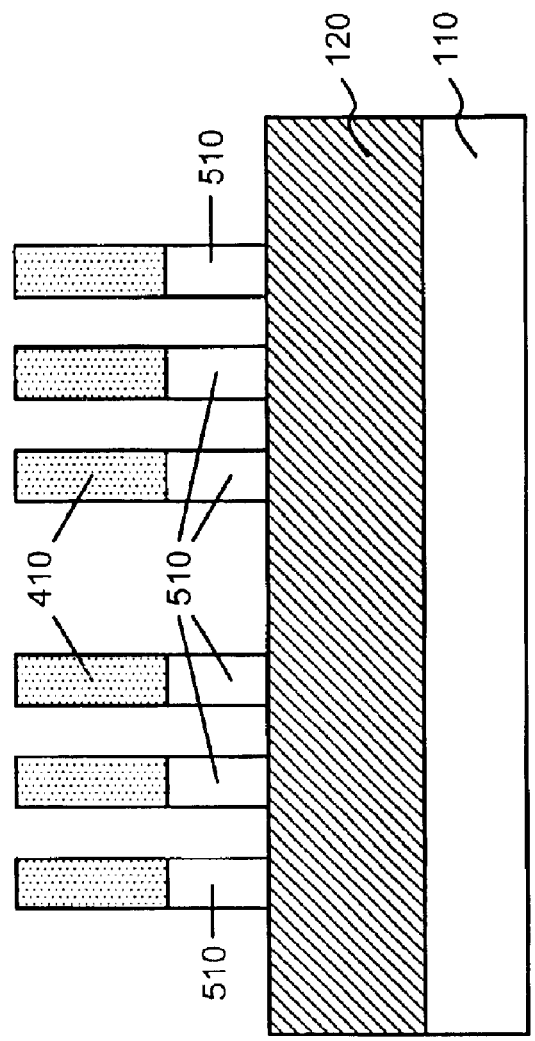
FIG. 5 is a cross-section illustrating the formation of fin structures on the device of FIG. 4 in accordance with an exemplary embodiment of the present invention.

Next, spacers 210, 230 and 250 and silicon layer 130 may be etched, with the etching terminating on buried oxide layer 120, as illustrated in FIG. 5. During the etching, the dielectric structures 410 act as a mask to prevent the portions of silicon layer 130 located below the dielectric structures 410 from being etched, resulting in silicon structures 510 located below dielectric structures 410, as illustrated in FIG. 5.

Figure 6:
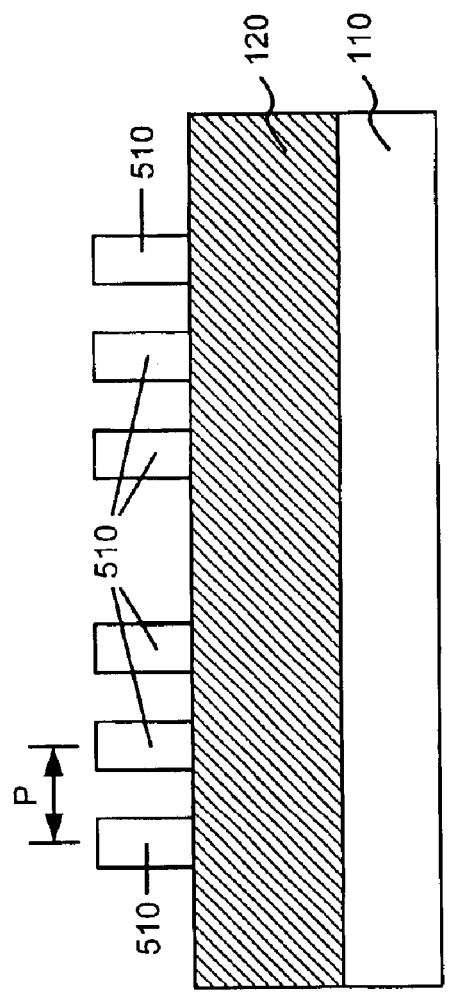
FIG. 6 is a cross-section illustrating the removal of the dielectric structures from the device of FIG. 5 in accordance with an exemplary embodiment of the present invention.

After the silicon layer 130 has been etched, the dielectric structures 410 may be removed via a conventional etching, resulting in semiconductor device 100 illustrated in FIG. 6. Referring to FIG. 6, semiconductor device 100 includes silicon structures 510, also referred to as fins or fin structures 510. The fins 510 are substantially parallel to each other and the center-to-center distance between the fins 510, referred to as the pitch, is represented by P. In the exemplary implementation described above, the value of P may be based on the width of the spacers 210–250. More particularly, if the width of spacers 210, 230 and 250 is defined by S1, as illustrated in FIG. 2A and the width of spacers 220 and 240 is defined by S2, as illustrated in FIG. 2B, the pitch P is equal to approximately S1 plus S2. The particular value of P that may be obtained in accordance with the present invention may be very small, e.g., as small as about 300 Å. However, as discussed above, it should be understood that the particular value of P may vary based on the particular circuit requirements associated with the fins and double gate device that will be formed.

Fin structures 510 may be used as fins in a FinFET device or as active lines in other devices. Advantageously, the pitch P of the fins formed in accordance with the present invention may be very small.

In an alternative implementation of the present invention, fins structures may be formed without forming dielectric layer 140 over conductive layer 130. For example, referring to FIG. 7A, semiconductor device 200 includes island 150 and spacers 210–250. The island 150 may be formed in a similar manner as that described above with respect to FIG. 1. The island 150 in FIG. 7A, however, is formed on silicon layer 130.

Figure 7A:
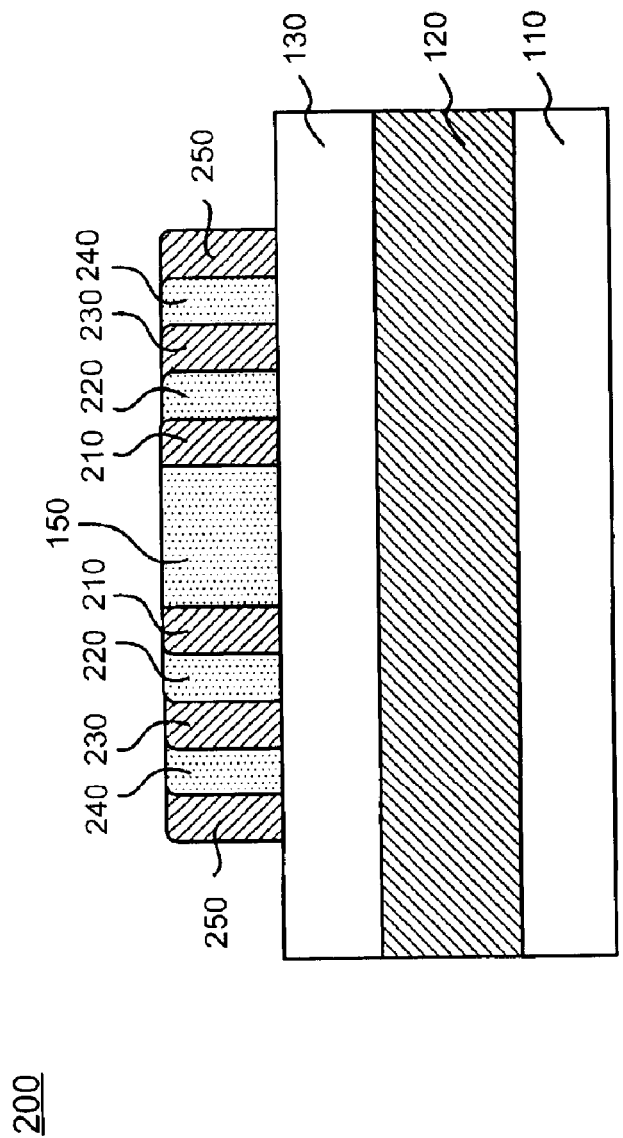
FIGS. 7A–7C are cross-sections illustrating the formation of fin structures in accordance with another exemplary embodiment of the present invention.

The spacers 210–250 may be formed in a similar manner as that described above with respect to FIGS. 2A–2D. That is, spacers formed of conductive and dielectric materials may be formed in an alternating manner on the sides of island 150, as illustrated in FIG. 7A. During the etching to form spacers 210–250, a small portion of silicon layer 130 may be etched. The particular number of spacers formed, however, may be limited to a predetermined number to ensure that silicon layer 130 is not completely removed in any areas. The particular number may be based on the thickness of silicon layer 130 and various etching parameters used to form the spacers.

Next, the semiconductor device 200 may be planarized via a CMP to planarize the top surface of semiconductor device 200, in a similar manner as described above with respect to FIG. 3 to expose the top surfaces of spacers 210–250. An oxide layer may be deposited prior to the CMP to facilitate the planarization. During the CMP, a portion of the upper surface of island 150 and spacers 210–250 may be removed so that the upper surface of each of the spacers 210–250 is exposed.

Figure 7B:
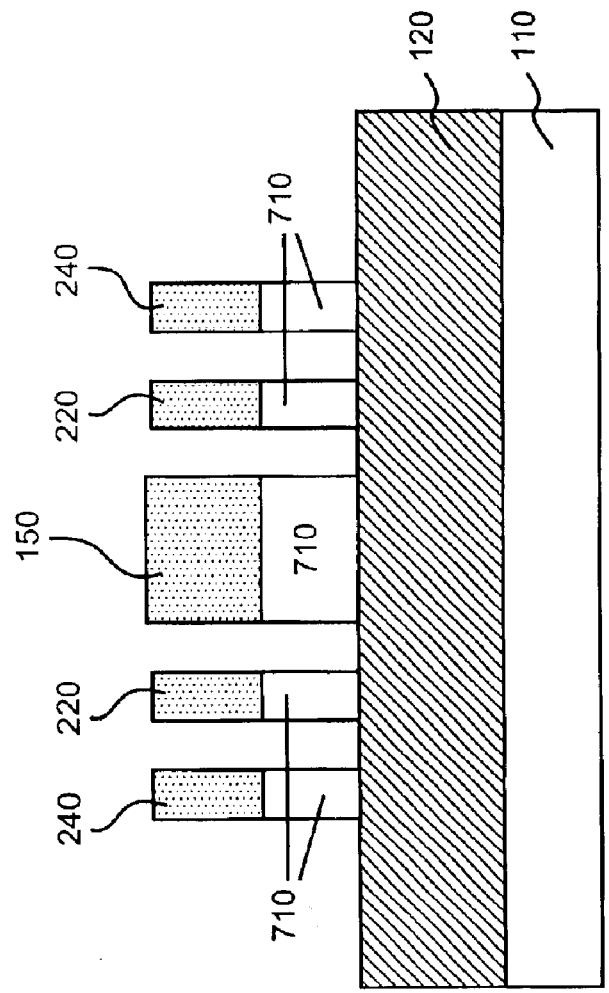

Spacers 210, 230 and 250 and silicon layer 130 may then be etched, with the etching terminating on buried oxide layer 120, as illustrated in FIG. 7B. Referring to FIG. 7B, during the etching, the island 150 and oxide spacers 220 and 240 act as a mask to prevent the portions of silicon layer 130 located below island 150 and spacers 220 and 240 from being etched, resulting in silicon structures 710 located below island 150 and spacers 220 and 240.

Figure 7C:
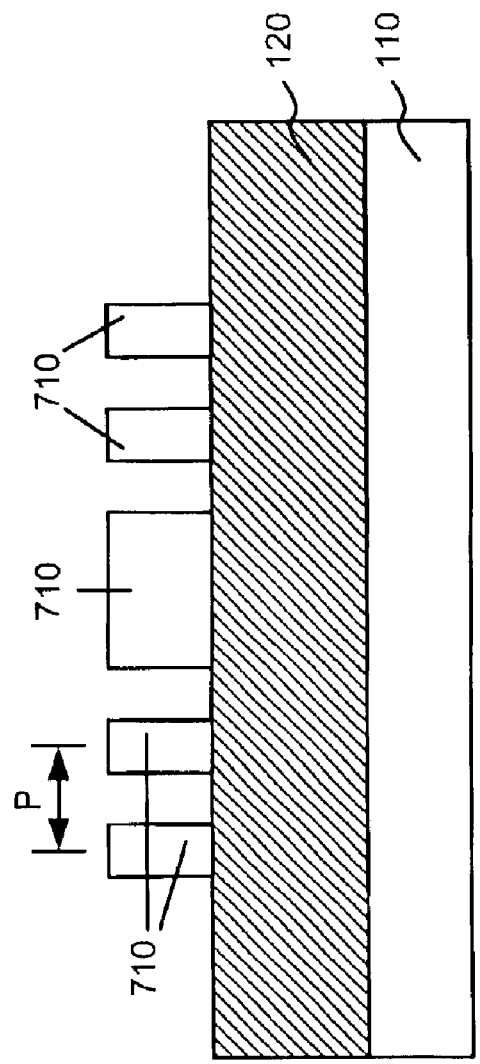

The island 150 and spacers 220 and 240 may then be removed via a conventional etching, resulting in semiconductor device 200 illustrated in FIG. 7C. Referring to FIG. 7C, semiconductor device 200 includes silicon structures/fins 710 that are substantially parallel to each other. Similar to the discussion above with respect to FIG. 6, the pitch P of fins 710 may be based on both the width of the spacers 210–250. More particularly, as discussed above, the pitch may be equal to S1 plus S2, where S1 defines the width of spacers 210, 230 and 250 and S2 defines the width of spacers 220 and 240. The particular value of P that may be obtained in accordance with the present invention may be very small, e.g., as small as about 300 Å. However, as discussed above, it should be understood that the particular value of P may vary based on the particular circuit requirements associated with the fins and double gate device that will be formed.

In addition, the width of island 150 has been depicted in the figures (e.g., FIG. 1 and FIG. 7A) as being wider than the spacers. It should be understood, however, that the particular width of island 150 may be based on the particular circuit requirements of the semiconductor device 100/200 to facilitate the formation of fins having the desired width and the desired pitch.

Figure 8:
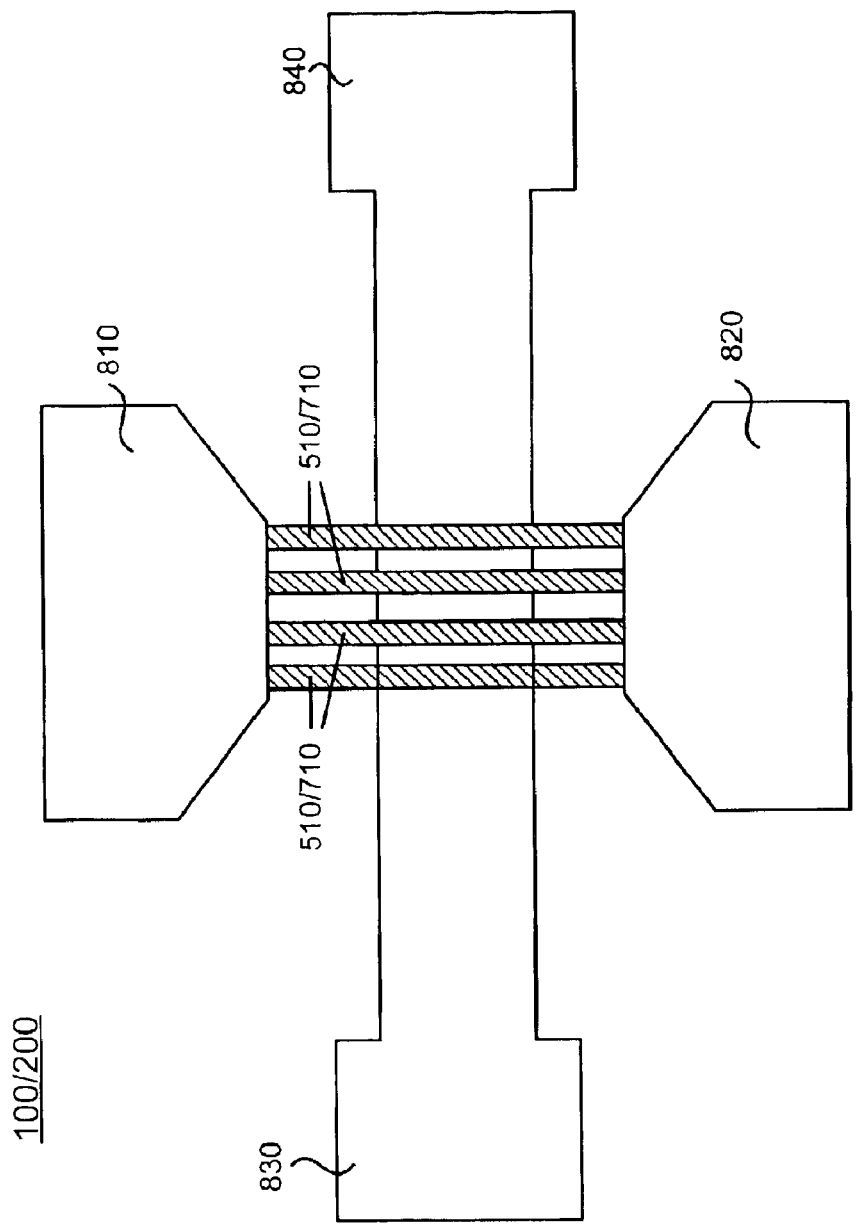
FIG. 8 is a top view illustrating an exemplary double gate device formed in accordance with an exemplary embodiment of the present invention.

After the fins 510 (or 710) are formed, a protective dielectric layer, such as a silicon nitride or silicon oxide may be formed on the top surface of fins 510/710, followed by the formation of a gate dielectric on the side surfaces of the fins 510/710. Source/drain regions may then be formed at the respective ends of the fins 510/710, followed by formation of one or more gates. For example, a silicon layer, germanium layer, combinations of silicon and germanium or various metals may be used as the gate material. The gate material may then be patterned and etched to form the gate electrodes. For example, FIG. 8 illustrates a top view of semiconductor device 100/200 consistent with the present invention after the source/drain regions and gate electrodes are formed. As illustrated, semiconductor device 100/200 includes a double-gate structure with fins 510/710, source and drain regions 810 and 820, and gate electrodes 830 and 840. Only four fins are shown in FIG. 8 for simplicity. It should be understood that more fins (e.g., five or more) or fewer fins (e.g., two fins) may be formed in embodiments consistent with the present invention.

The source/drain regions 810 and 820 may then be doped with n-type or p-type impurities based on the particular end device requirements. In addition, sidewall spacers may optionally be formed prior to the source/drain ion implantation to control the location of the source/drain junctions based on the particular circuit requirements. Activation annealing may then be performed to activate the source/drain regions 810 and 820.

The present invention has been described above as forming a number of fins. It should be understood that methods consistent with the present invention may be used to form any number of fins having the desired pitch, based on the particular circuit requirements.

Thus, in accordance with the present invention, a FinFET device may be formed with multiple fins having a small pitch. Advantageously, the methodology for forming fins in accordance with the present invention allows multiple fins to be formed more closely together than that realized in conventional processing. Having multiple fins enables the resulting semiconductor device to increase the channel width per device as compared to a single fin FinFET device. In addition, by forming the multiple fins more closely together, the present invention is able to provide more fins in a smaller area than that obtained using conventional processes. Therefore, the present invention provides increased flexibility. The present invention can also be easily integrated into conventional semiconductor fabrication processing.

Other Embodiments

Figure 9A:
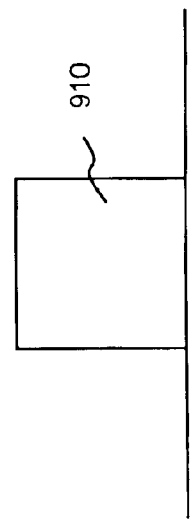
FIGS. 9A–9C are cross-sections illustrating the formation of multiple spacers and silicided regions in the source/drain regions in accordance with another embodiment of the present invention.

In other embodiments of the present invention, FinFETs with multiple spacers may be formed. For example, FIG. 9A illustrates a cross-sectional view of semiconductor device 900 that includes gate 910. The semiconductor device 900 may be a FinFET device. The fin(s) in device 900, however, are not shown for simplicity.

Figure 9B:
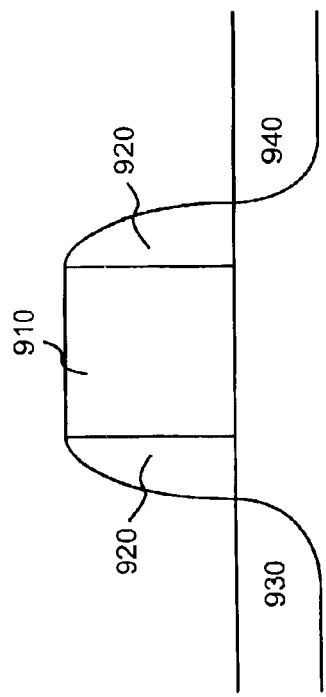

After the gate 910 has been formed, spacers 920 may be formed on the side surfaces of gate 910. Impurities may then be ion implanted to form source/drain regions 930 and 940, as illustrated in FIG. 9B. The particular implantation dosages and energies may be optimized based on the particular circuit requirements.

Figure 9C:
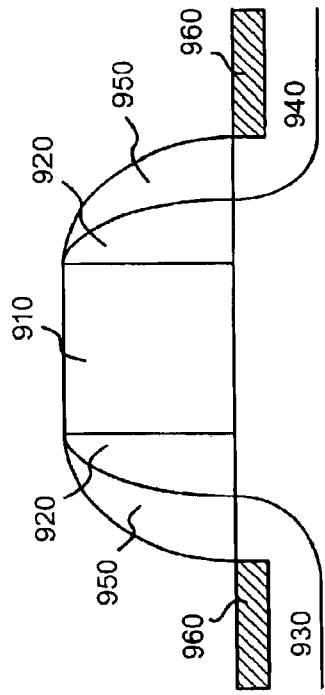

A second set of sidewall spacers 950 may then be formed adjacent sidewall spacers 920, as illustrated in FIG. 9C. After forming sidewall spacers 950, a metal may be deposited on source/drain regions 930 and 940, followed by a thermal annealing to form a metal-silicide 960 in the source/drain regions 920 and 930, as illustrated in FIG. 9C. The resulting semiconductor device 900 includes silicided regions 960 formed away from the channel region.

In the previous descriptions, numerous specific details are set forth, such as specific materials, structures, chemicals, processes, etc., in order to provide a thorough understanding of the present invention. However, the present invention can be practiced without resorting to the specific details set forth herein. In other instances, well known processing structures have not been described in detail, in order not to unnecessarily obscure the thrust of the present invention.

The dielectric and conductive layers used in manufacturing a semiconductor device in accordance with the present invention can be deposited by conventional deposition techniques. For example, metallization techniques, such as various types of CVD processes, including low pressure CVD (LPCVD) and enhanced CVD (ECVD) can be employed.

The present invention is applicable in the manufacturing of double-gate semiconductor devices and particularly in FinFET devices with design features of 100 nm and below. The present invention is applicable to the formation of any of various types of semiconductor devices, and hence, details have not been set forth in order to avoid obscuring the thrust of the present invention. In practicing the present invention, conventional photolithographic and etching techniques are employed and, hence, the details of such techniques have not been set forth herein in detail.

In addition, no element, act, or instruction used in the description of the present application should be construed as critical or essential to the invention unless explicitly described as such. Also, as used herein, the article "a" is intended to include one or more items. Where only one item is intended, the term "one" or similar language is used.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed is:

1. A method of forming a plurality of fins in a FinFET device, comprising:

forming a dielectric layer on a silicon on insulator (SOI) wafer, the SOI wafer comprising a conductive layer disposed on an insulating layer, the conductive layer being used to form the plurality of fins;

forming a structure on a portion of the dielectric layer, the structure including an upper surface and side surfaces;

forming a first plurality of spacers adjacent the side surfaces of the structure;

forming a second plurality of spacers adjacent the first plurality of spacers;

planarizing the structure and the first and second plurality of spacers to expose an upper surface of each of the first and second plurality of spacers;

removing the structure, the second plurality of spacers and a portion of the dielectric layer located below the second plurality of spacers, wherein a remaining portion of the dielectric layer forms a plurality of dielectric structures located below the first plurality of spacers; and removing the first plurality of spacers and a portion of the conductive layer not located below the plurality of dielectric structures to form the plurality of fins, wherein the removing the first plurality of spacers and the portion of the conductive layer not located below the plurality of dielectric structures is performed subsequent to removing the structure, the second plurality of spacers and the portion of the dielectric layer located below the second plurality of spacers.

2. The method of claim 1, further comprising:

removing the plurality of dielectric structures.

3. The method of claim 1, wherein a pitch of the plurality of fins ranges from about 300 Å to about 1500 Å.

4. The method of claim 1, wherein a width of the first plurality of spacers ranges from about 100 Å to about 500 Å and a width of the second plurality of spacers ranges from about 200 Å to about 1000 Å.

5. The method of claim 1, wherein the planarizing the structure comprises:

performing a chemical-mechanical polishing.

6. The method of claim 1, wherein the removing the structure, the second plurality of spacers and the portion of the dielectric layer located below the second plurality of spacers comprises:

performing a dry etching.

7. The method of claim 1, wherein the first and second plurality of spacers are formed in an alternating manner such that none of the first plurality of respective spacers are formed adjacent to each other.

8. The method of claim 1, wherein the first plurality of spacers and the conductive layer each comprise silicon and the second plurality of spacers and the dielectric layer each comprise an oxide.

9. A method of manufacturing a semiconductor device, comprising:

depositing a dielectric layer over a conductive layer;

forming a first structure over the dielectric layer, the first structure having a substantially rectangular cross-sectional shape;

forming a plurality of first spacers on side surfaces of the first structure;

etching the first structure and the dielectric layer, the etching resulting in a plurality of dielectric structures located below the plurality of first spacers; and etching the plurality of first spacers and the conductive layer after etching the first structure and the dielectric layer, wherein the dielectric structures act as a mask to prevent a portion of the conductive layer from being etched and an un-etched portion of the conductive layer forms a plurality of fins.

10. The method of claim 9, further comprising:

forming a source region and a drain region;

depositing a gate material over the plurality of fins; and patterning and etching the gate material to form at least one gate electrode.

11. The method of claim 9, further comprising:

forming a plurality of second spacers adjacent the plurality of first spacers, the plurality of first and second spacers being formed in an alternating manner.

12. The method of claim 11, wherein the etching the first structure and the dielectric layer removes the plurality of second spacers and a width of the plurality of first and second spacers defines a pitch for the plurality of fins.

13. The method of claim 12, wherein a width of the plurality of first spacers ranges from about 100 Å to about 500 Å and a width of the plurality of second spacers ranges from about 200 Å to about 1000 Å.

14. The method of claim 12, wherein the pitch of the plurality of fins ranges from about 300 Å to about 1500 Å.

15. The method of claim 11, wherein the plurality of first spacers and the conductive layer each comprise silicon and the plurality of second spacers and the dielectric layer each comprise a silicon oxide.

16. A method of forming a plurality of structures in a semiconductor device, comprising:

forming a first structure over a conductive layer, the first structure having an upper surface and side surfaces;

forming a first plurality of spacers adjacent the side surfaces of the first structure;

forming a second plurality of spacers adjacent the first plurality of spacers;

etching the first plurality of spacers and the conductive layer, wherein the first structure and the second plurality of spacers act as a mask to prevent a portion of the conductive layer from being etched and an un-etched portion of the conductive layer forms the plurality of structures; and removing the first structure and the second plurality of spacers after etching the first plurality of spacers and the conductive layer.

17. The method of claim 16, wherein the semiconductor device comprises a FinFET device and the plurality of structures comprise fins.

18. The method of claim 17, further comprising:

depositing an oxide layer over the first structure and the first and second plurality of spacers prior to the etching; and planarizing the first structure and the first and second plurality of spacers prior to the etching.

19. The method of claim 17, wherein a width of the respective first and second plurality of spacers defines a pitch for the fins.

20. The method of claim 16, wherein the first plurality of spacers and the conductive layer each comprise silicon and the first structure and the second plurality of spacers each comprise a silicon oxide.

* * * * *